United States Patent [19]
Iwasaki

[11] Patent Number: 5,500,878
[45] Date of Patent: Mar. 19, 1996

[54] AUTOMATIC FREQUENCY CONTROL APPARATUS AND METHOD THEREFOR

[75] Inventor: Motoya Iwasaki, Tokyo, Japan

[73] Assignee: NEC Corporation, Tokyo, Japan

[21] Appl. No.: 255,367

[22] Filed: Jun. 8, 1994

[30] Foreign Application Priority Data

Jun. 8, 1993 [JP] Japan .................................. 5-164070

[51] Int. Cl.⁶ .............................. H03J 7/00; H04L 27/06; H04L 7/04
[52] U.S. Cl. ...................... 375/344; 375/327; 455/164.1; 329/308
[58] Field of Search ...................... 375/330, 344, 375/261, 306, 311, 312, 357, 362, 324, 327, 326, 325; 455/164.1, 164.2; 329/325, 306–308, 360

[56] References Cited

U.S. PATENT DOCUMENTS

| | | | |
|---|---|---|---|
| 3,940,702 | 2/1976 | Yoshimura et al. | 455/180.2 |
| 4,053,838 | 10/1977 | Amaya | 455/164.1 |
| 4,591,914 | 5/1986 | Hakamada et al. | 358/190 |
| 5,023,813 | 6/1991 | Brown, III | 364/519 |
| 5,247,543 | 9/1993 | Tsuda et al. | 375/325 |

FOREIGN PATENT DOCUMENTS

| | | |
|---|---|---|
| 445522 | 9/1991 | European Pat. Off. . |
| 61-245642 | 10/1986 | Japan . |
| 61-264930 | 11/1986 | Japan . |
| 3-52423 | 3/1991 | Japan . |
| 3263937 | 11/1991 | Japan . |
| 4286220 | 10/1992 | Japan . |

OTHER PUBLICATIONS

Alain Blanchard, "Phase–Locked Loops/Application to Coherent Receiver Design", A Wiley–Interscience Publication, 1976 by John Wiley & Sons, Inc., pp. 281–287.

Primary Examiner—Young T. Tse
Assistant Examiner—William Luther

[57] ABSTRACT

An automatic frequency control apparatus includes a local oscillator, a quadrature detector, a frequency offset value estimation circuit, a demodulation circuit, a synchronization determination circuit, a memory, and an AFC circuit. The synchronization determination circuit determines reception synchronization on the basis of demodulated signals from the demodulation circuit to output a synchronization determination signal to the AFC circuit when reception synchronization is established and outputs the value to the AFC circuit. The apparatus also includes a power-on state detection circuit for outputting a detection signal to the AFC circuit. The AFC circuit determines the oscillation frequency of the local oscillator on the basis of the outputs from the above components. An automatic frequency control method is also disclosed.

6 Claims, 3 Drawing Sheets

AUTOMATIC FREQUENCY CONTROL APPARATUS AND METHOD THEREFOR

BACKGROUND OF THE INVENTION

The present invention relates to an automatic frequency control apparatus and a method therefor which are used in a microwave band satellite communication system or the like and always establish reception synchronization at a high speed even when a power supply is frequently turned on/off.

FIG. 3 shows the arrangement of a conventional automatic frequency control apparatus. Referring to FIG. 3, this automatic frequency control apparatus has mixers 1 and 2 for respectively outputting an I (In Phase) signal and a Q (Quadrant Phase) signal serving as pseudo synchronization detection signals of a baseband from a received input signal Sa of an IF or RF frequency band, a local oscillator 3 for controlling an oscillation frequency on the basis of the value of an AFC (Automatic Frequency Control) voltage Sv to output a local oscillation signal So to the mixer 1, and a 90° phase shifter 4 for phase-shifting the local oscillation signal So by 90° (π/2) to supply the phase-shifted signal to the mixer 2.

In addition, this automatic frequency control apparatus has a demodulation circuit 5 for performing demodulation on the basis of the I and Q signals from the mixers 1 and 2, a frequency offset value estimation circuit 7 for estimating the frequency offset value of the I and Q signals serving as the pseudo synchronization detection signals when no reception synchronization is established, and an AFC circuit 8 for outputting the AFC voltage Sv to the local oscillator 3 on the basis of the output from the frequency offset value estimation circuit 7.

An operation of the arrangement of this prior art will be described below.

After a power supply is turned on, the frequency offset value of received signals is estimated by the frequency offset value estimation circuit 7. The AFC circuit 8 outputs the AFC voltage Sv on the basis of the frequency offset value to shift the local oscillation signal So output from the local oscillator 3. This shifted local oscillation signal So is supplied to the mixer 1 and phase-shifted by 90° (π/2) using the 90° phase shifter 4, and the phase-shifted signal is supplied to the mixer 2. In this case, a frequency offset occurring when the power supply is turned on is removed, the I and Q signals serving as the pseudo synchronization detection signals of the baseband are obtained from the received input signal Sa in the mixers 1 and 2, respectively.

In the automatic frequency control apparatus operated as described above, estimation of a frequency offset value and control of a local oscillation frequency must be performed each time the power supply of the apparatus is turned on. A long time, e.g., 1 second, is required for this control. For this reason, as in a case wherein power is supplied from, e.g., the battery of an automobile, when a power supply voltage becomes unstable or immediately interrupted by turning on/off a load, estimation of a frequency offset value and control of a local oscillation frequency may not be correctly established.

Assume that an intermittent reception mode for power saving is set. That is, a power supply is normally set in an OFF state (OFF) and periodically turned on (ON), and the power supply is turned off (OFF) again when no call is received while the power supply is set in an ON state, thereby performing intermittent reception. In this case, several seconds are required for establishing reception synchronization obtained each time the power supply is turned on (ON), and the intermittent reception for power saving cannot be performed at a predetermined time interval.

As countermeasures against the drawback of this type, an "office identification code detection scheme" disclosed in Japanese Patent Laid-Open No. 3-052423, a "frequency offset estimation scheme" disclosed in Japanese Patent Laid-Open No. 61-264930, and a "frequency offset estimation scheme" disclosed in Japanese Patent Laid-Open No. 61-245642 are proposed.

According to Japanese Patent Laid-Open No. 3-052423, a burst clock signal is supplied to an office identification code correlation detector and a clock signal multiplier to operate them in only a period in which a reception burst signal is present, and a burst clock signal is inhibited in a period in which no reception burst signal is present, thereby shortening a time required for establishing reception synchronization.

According to Japanese Patent Laid-Open No. 61-264930, a signal having a period length corresponding to one symbol is supplied in a plurality of periods, and the phases of two received signals which are shifted by at least one period are compared with each other. A frequency offset is estimated on the basis of the comparison result, thereby making accurate estimation of a frequency component possible. According to Japanese Patent Laid-Open No. 61-245642, a test signal having a period length corresponding to one symbol is received in a plurality of periods, the phases of two predetermined signals are compared with each other, and the comparison result is divided by the number of symbols to be received between two sampling reception time, thereby easily estimating a frequency offset within a short time.

In the prior arts described above, a time required for establishing reception synchronization can be shortened, a frequency component can be estimated at high accuracy, and a frequency offset can be easily estimated within a short time. However, when a power supply is frequently turned on/off, reception synchronization cannot be established at a high speed. In addition, since the phases of two received signals are compared with each other to estimate a frequency offset, the frequency offset cannot be estimated by a single apparatus, and an apparatus arrangement is disadvantageously complicated.

SUMMARY OF THE INVENTION

It is an object of the present invention to provide an automatic frequency control apparatus and a method therefor in which, even when a power supply is frequently turned on/off, reception synchronization can always be established at a high speed with a relatively simple structure.

In order to achieve the above objects, according to the present invention, there is provided an automatic frequency control apparatus comprising local oscillation means for outputting a local oscillation signal having an oscillation frequency controlled by a frequency control voltage, quadrature detection means for quadrature-detecting a received signal using the local oscillation signal from the local oscillation means, frequency offset value estimation means for estimating a frequency offset value of the received signal on the basis of quadrature detection signals from the quadrature detection means, demodulation means for demodulating the quadrature detection signals from the quadrature detection means, synchronization determination means for determining reception synchronization on the basis of demodulated signals from the demodulation means to output a synchronization determination signal when reception synchronization is established, storage means for storing a frequency control voltage value obtained when reception synchronization is established, and frequency control means for repeatedly changing a frequency control voltage to the local oscillation means on the basis of the frequency offset value from the frequency offset value determination means until reception synchronization is established when no synchronization signal is output from the synchronization determination means and controlling the oscillation frequency of the local oscillation means by the frequency control voltage read out from the storage means when a power supply is turned on.

BRIEF DESCRIPTION OF THE DRAWINGS

FIG. 1 is a block diagram showing an embodiment of an automatic frequency control apparatus according to the present invention;

DESCRIPTION OF THE PREFERRED EMBODIMENT

Figure 2:
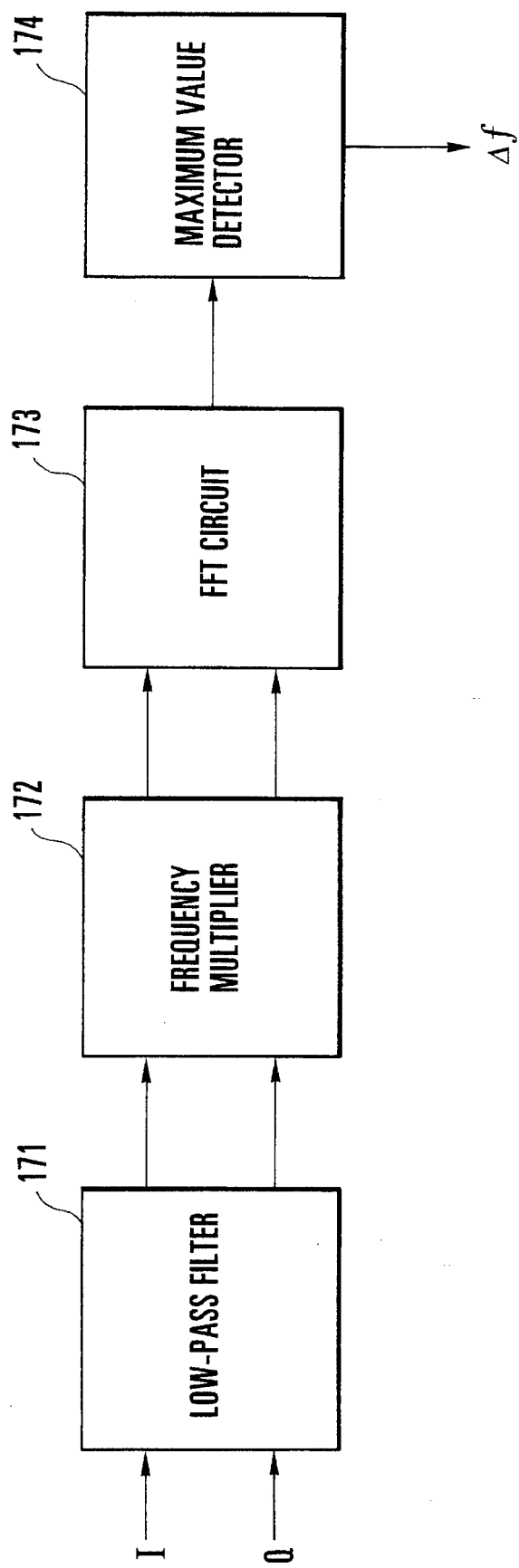
FIG. 2 is a block diagram showing an example of a frequency offset value estimation circuit 17 in FIG. 1.
Figure 2:
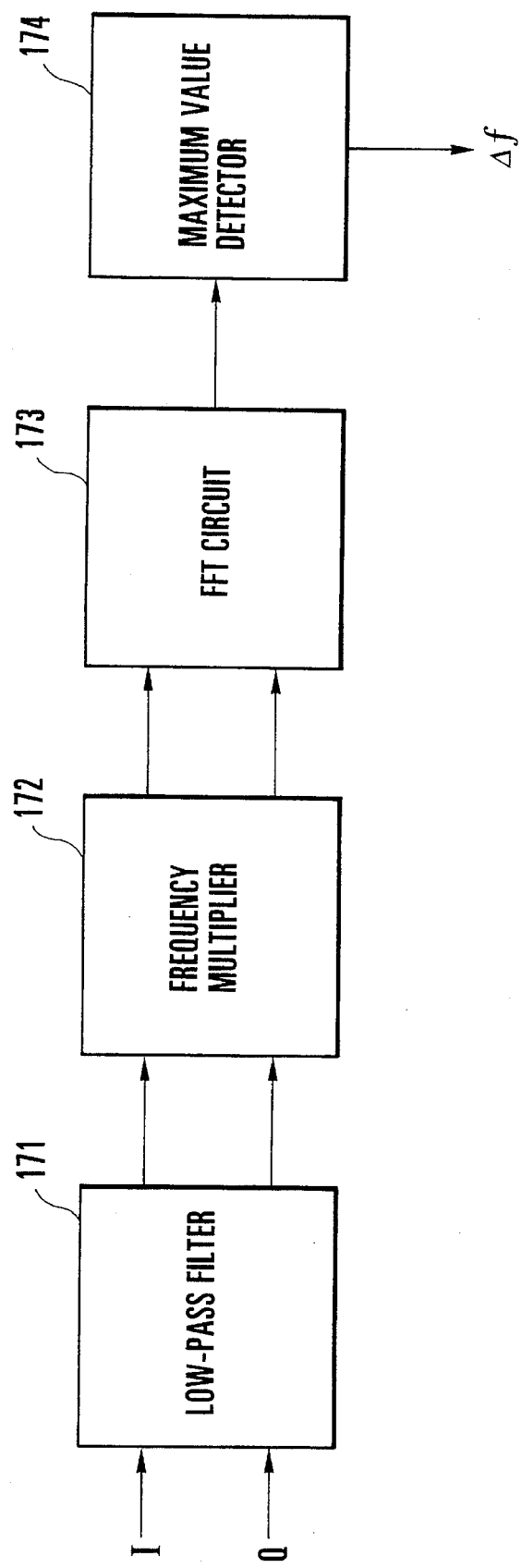
Figure 3:
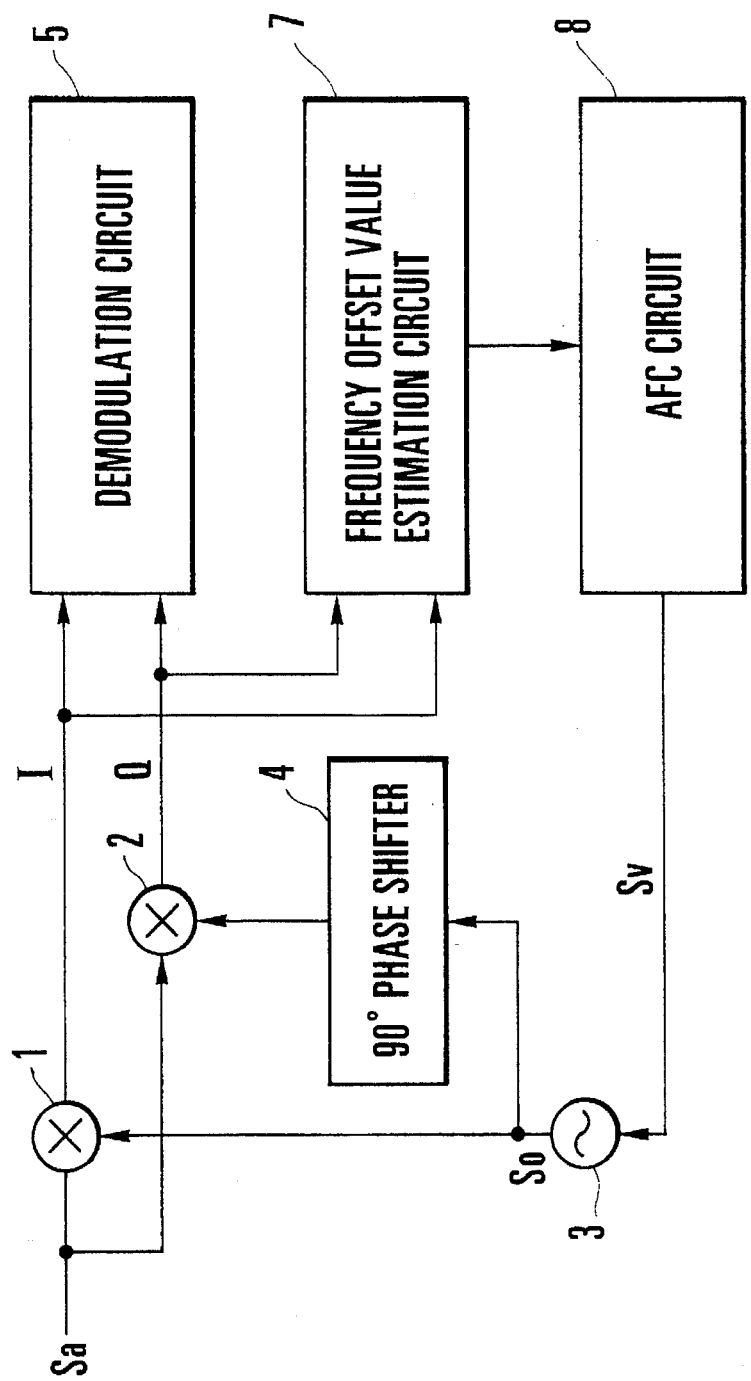
FIG. 3 is a block diagram showing the arrangement of a conventional automatic frequency control apparatus.

An embodiment of an automatic frequency control apparatus according to the present invention will be described below with reference to the accompanying drawings.

FIG. 1 shows the arrangement of the embodiment of the automatic frequency control apparatus according to the present invention. Referring to FIG. 1, this automatic frequency control apparatus has mixers 11 and 12 for respectively outputting I and Q signals serving as pseudo synchronization detection signals of a baseband input signal Sa of an IF or RF frequency band.

In addition, this automatic frequency control apparatus controls an oscillation frequency on the basis of the value of an AFC voltage Sv, and has a local oscillator 13 for outputting a local oscillation signal So to the mixer 11 and a 90° phase shifter 14 for phase-shifting this local oscillation signal So by 90° ($\pi/2$) to supply the phase-shifted signal to the mixer 12.

The automatic frequency control apparatus has a demodulation circuit 15 for performing demodulation on the basis of the I and Q signals from the mixers 11 and 12 to output demodulated signals Ia and Qa and a reception synchronization determination circuit 16 for determining reception synchronization on the basis of the signals Ia and Qa from the demodulation circuit 15 to output a synchronization determination signal St.

In addition, the automatic frequency control apparatus has an AFC circuit 18 for outputting an AFC voltage Sv to the local oscillator 13 on the basis of an output from a frequency offset value determination circuit and the synchronization determination signal St from the reception synchronization determination circuit 16, a frequency offset value estimation circuit 17 for estimating the frequency offset value of the I and Q signals serving as pseudo synchronization detection signals when no reception synchronization is established, a nonvolatile memory 19 for storing the value of the AFC voltage Sv obtained in a power-off (OFF) state, and a power-on state detection circuit 20 for detecting a power-on state to output a detection signal to the AFC circuit 18.

An operation in the arrangement of this embodiment will be described below.

The received input signal Sa is input to the mixers 11 and 12. A local oscillation signal So from the local oscillator 13 and a local oscillation signal So obtained by phase-shifting the local oscillation signal So from the local oscillator 13 using the 90° phase shifter 14 are supplied to the mixers 11 and 12, respectively. In the mixers 11 and 12, these signals are multiplied by the received input signal Sa and converted into the I and Q signals serving as pseudo synchronization detection signals of the baseband.

These converted I and Q signals are input to the demodulation circuit 15 and demodulated. The demodulated signals Ia and Qa are input to the reception synchronization determination circuit 16 to determine reception synchronization. The synchronization determination signal St obtained by determining the reception synchronization is output to the AFC circuit 18.

The frequency offset value estimation circuit 17 estimates a frequency offset value $\Delta f$ of the I and Q signals serving as the pseudo synchronization detection signals when no reception synchronization is established. FIG. 2 shows the frequency offset value estimation circuit 17. The I and Q signals to be input pass through a band-limiting low-pass filter 171, are frequency-multiplied by a frequency multiplier 172 in accordance with a modulation scheme, and then are subjected to fast Fourier transform by an FFT (Fast Fourier Transform) circuit 173, thereby estimating frequency errors. A maximum value detector 174 detects the maximum value of the frequency errors estimated by the FFT circuit 173 to output the frequency offset value $\Delta f$. The AFC circuit 18 changes the AFC voltage Sv by $\Delta V$ (= a change in voltage corresponding to $a\Delta f$) on the basis of the frequency offset value $\Delta f$ from the frequency offset value estimation circuit 17 such that a frequency f0 of the local oscillation signal So from the local oscillator 13 is set to be (f0–$\Delta f$).

When no reception synchronization is established by the change in the AFC voltage Sv, the above operation is repeated until reception synchronization is established. When reception synchronization is established by the change in the AFC voltage Sv, the value of the AFC voltage Sv is written in the nonvolatile memory 19 whose stored contents are not erased even when the power supply is set in an OFF state. Thereafter, when the power supply (not shown) is turned on (ON) to output a detection signal from the power-on state detection circuit 20, and a reception operation is started, the AFC circuit 18 reads out the value of the AFC voltage Sv stored in the nonvolatile memory 19 by sequence control and then inputs the read value to the local oscillator 13. The local oscillator 13 inputs a local oscillation signal So having a frequency based on the AFC voltage Sv stored in the nonvolatile memory 19 to the mixer 11 and the 90° phase shifter 14 and starts a reception operation for the received input signal Sa.

In the above embodiment, the AFC voltage Sv may be stored in a volatile memory which is bucked up even in a power-off state in place of the nonvolatile memory 19. In addition, the frequency offset value $\Delta f$ from the frequency offset value estimation circuit 17 may be stored in the nonvolatile memory 19, and the AFC voltage Sv may be controlled on the basis of the stored frequency offset value $\Delta f$ until reception synchronization is established.

An intermittent receiver for performing an intermittent receiving operation can be arranged such that a power from a power supply, which is set in an ON state for, e.g., 0.3 sec.

and set in an OFF state for, e.g., 0.7 sec., is repeatedly supplied to the mixers 11 and 12, the local oscillator 13, the 90° phase shifter 14, the demodulation circuit 15, the reception determination circuit 16, the frequency offset value estimation circuit 17, and the AFC circuit 18 in a one-second cycle. In this intermittent receiver, a power from the power supply is supplied to each of the above circuits each time the power supply is automatically turned on in a one-second cycle, and, at the same time, by receiving a detection signal from the power-on state detection circuit 20 or internally detecting the start of supplying a power, the AFC circuit 18 reads out the value of an AFC voltage Sv stored in the nonvolatile memory 19 to input the readout value to the local oscillator 13. The local oscillator 13 inputs a local oscillation signal S0 having a frequency based on the AFC voltage Sv read from the nonvolatile memory 19 to the mixer 11 and the 90° phase shifter 14 to intermittently perform a receiving operation of the received input signal Sa for every 0.3 sec. In this manner, the present invention can be applied even when the power supply for an intermittent receiving operation is turned on, and the intermittent receiving operation for power saving can be performed in a short cycle.

As has been described above, according to the present invention, in an automatic frequency control apparatus and a method therefor, a frequency control voltage value obtained when reception synchronization is established is stored, and a local oscillation frequency is determined on the basis of a frequency control voltage stored when a power supply is turned on. In addition, when no reception synchronization is established, the frequency control voltage value is changed on the basis of a frequency offset value to determine the local oscillation frequency. For this reason, even when the power supply is frequently turned on/off, an effect that reception synchronization can always be established at a high speed can be obtained.

What is claimed is:

1. An automatic frequency control apparatus comprising:
   local oscillation means for outputting a local oscillation signal having an oscillation frequency controlled by a frequency control voltage;
   quadrature detection means for quadrature-detecting a received signal using the local oscillation signal received from said local oscillation means;
   frequency offset value estimation means for estimating a frequency offset value of the received signal from quadrature detection signals received from said quadrature detection means;
   demodulation means for demodulating the quadrature detection signals received from said quadrature detection means and outputting demodulated signals;
   synchronization determination means, coupled to said demodulation means, for determining reception synchronization according to said demodulated signals received from said demodulation means to output a synchronization determination signal when reception synchronization with a single received frequency is established;
   frequency control means, coupled to said local oscillation means and to said synchronization determination means, for generating said frequency control voltage and outputting said frequency control voltage to said local oscillation means;
   non-volatile memory means, coupled to said frequency control means, for storing a frequency control voltage received from said frequency control means obtained when said reception synchronization is established; and
   said frequency control means being also coupled to said frequency offset value estimation means, for repeatedly changing a frequency control voltage to said local oscillation means according to the frequency offset value received from said frequency offset value estimation means until reception synchronization is established when no synchronization determination signal is output from said synchronization determination means, and controlling the oscillation frequency of said local oscillation means by the frequency control voltage read out from said non-volatile memory means when a power supply is turned on, said frequency control means effecting storing of the frequency control voltage into said memory means when the synchronization determination signal is output from said synchronization determination means to said frequency control means.

2. An apparatus according to claim 1, wherein a power from a power supply which is set in an ON state for a predetermined period of time in a predetermined cycle is intermittently supplied to said local oscillation means, said quadrature detection means, said frequency offset value estimation means, said demodulation means, said synchronization determination means, and said frequency control means, and said frequency control means reads out a frequency control voltage from said memory means each time the power supply is intermittently supplied, thereby controlling an oscillation frequency of said local oscillation means.

3. An apparatus according to claim 1, further comprising power-on state detection means for detecting a power-on state to output a detection signal to said frequency control means, and wherein said frequency control means reads out the frequency control voltage from said memory means when the detection signal is output from said power-on state detection means.

4. An automatic frequency control apparatus comprising:
   local oscillation means for outputting a local oscillation signal having an oscillation frequency controlled by a frequency control voltage;
   quadrature detection means for quadrature-detecting a received signal using the local oscillation signal from said local oscillation means;
   frequency offset value estimation means for estimating a frequency offset value from quadrature detection signals received from said quadrature detection means;
   demodulation means for demodulating the quadrature detection signals from said quadrature detection means;
   synchronization determination means, coupled to said demodulation means, for determining reception synchronization according to demodulated signals received from said demodulation means to output a synchronization determination signal when reception synchronization with a single received frequency is established;
   frequency control means, coupled to said local oscillation means and said synchronization determination means, for generating said frequency control voltage and outputting said frequency control voltage to said local oscillation means;
   non-volatile memory means, coupled to said frequency control means, for storing a frequency control voltage obtained from said frequency control means when said reception synchronization is established; and
   power-on state detection means for detecting a power-on state to output a detection signal;
   said frequency control means being further coupled to said frequency offset value estimating means and said power-on state detection means, for repeatedly changing a frequency control voltage to be outputted to said local oscillation means according to the frequency offset value received from said frequency offset value estimation means until reception synchronization is established when no synchronization determination signal is output from said synchronization determination means, said memory means storing a frequency control voltage at which reception synchronization is established when the synchronization determination signal is output from said synchronization determination means to said frequency control means, and said frequency control means determining the oscillation frequency of said local oscillation means from a frequency control voltage read out from said memory means when the detection signal is output from said power-on state detection means.

5. A method of automatically controlling a frequency, comprising steps of:

quadrature-detecting a received signal using a local oscillation signal from local oscillation means having an oscillation frequency controlled by a frequency control signal;

estimating a frequency offset value of quadrature detection signals;

demodulating the quadrature detection signals and obtaining demodulated signals;

determining reception synchronization according to said demodulated signals;

generating said frequency control signal in a frequency control means and outputting said frequency control signal to said local oscillation means;

when no reception synchronization is established, repeatedly changing a frequency control voltage according to an estimated frequency offset value until reception synchronization is established;

when reception synchronization is established, storing a frequency control voltage obtained when the reception synchronization is established; and when a power supply is turned on, controlling the oscillation frequency of said local oscillation means by the stored frequency control voltage, wherein the frequency control voltage obtained when the reception synchronization is established is stored in non-volatile storage means.

6. A method according to claim 5, further comprising the step of intermittently supplying a power from a power supply which is set in an ON state for a predetermined period of time in a predetermined cycle to a signal receiving system, and wherein the step of controlling the oscillation frequency comprises the step of controlling an oscillation frequency of said local oscillation means by the stored frequency control voltage each time the power supply is intermittently tuned on.

* * * * *